(12) United States Patent
Yamaguchi et al.

(10) Patent No.: US 12,516,444 B2
(45) Date of Patent: Jan. 6, 2026

(54) SiC SINGLE CRYSTAL SUBSTRATE

(71) Applicant: Resonac Corporation, Tokyo (JP)

(72) Inventors: Takuya Yamaguchi, Tokyo (JP); Koji Kamei, Tokyo (JP); Naoki Oyanagi, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/328,263

(22) Filed: Jun. 2, 2023

(65) Prior Publication Data

US 2023/0392288 A1 Dec. 7, 2023

(30) Foreign Application Priority Data

Jun. 3, 2022 (JP) .................. 2022-090957

(51) Int. Cl.
*C30B 29/36* (2006.01)

(52) U.S. Cl.
CPC .................. *C30B 29/36* (2013.01)

(58) Field of Classification Search
CPC ......... H01L 21/02378; H01L 21/02529; H01L 29/1608; C23C 16/325; C30B 29/36; G01N 21/6489; C01B 32/956
See application file for complete search history.

(56) References Cited

U.S. PATENT DOCUMENTS

| | | | | |
|---|---|---|---|---|
| 11,519,098 B2 * | 12/2022 | Khlebnikov | ............ | C30B 29/36 |
| 11,655,561 B2 * | 5/2023 | Suo | ............ | C30B 23/066 |
| | | | | 252/500 |
| 2012/0235165 A1 * | 9/2012 | Harada | ............. | H10D 62/8325 |
| | | | | 257/77 |
| 2013/0071643 A1 * | 3/2013 | Harada | ............. | H01L 21/02631 |
| | | | | 117/106 |
| 2014/0070234 A1 | 3/2014 | Loboda et al. | | |
| 2014/0127466 A1 | 5/2014 | Danno | | |
| 2016/0268381 A1 * | 9/2016 | Ota | ......... | H10D 62/53 |
| 2018/0363166 A1 * | 12/2018 | Wada | .................... | H01L 21/046 |
| 2019/0376206 A1 * | 12/2019 | Fukada | ............. | H01L 21/02378 |
| 2020/0083330 A1 * | 3/2020 | Fukada | ............. | H01L 21/02433 |
| 2021/0108334 A1 * | 4/2021 | Kamata | ................... | C30B 29/36 |
| 2021/0123843 A1 * | 4/2021 | Park | ..................... | C30B 23/002 |
| 2021/0225646 A1 * | 7/2021 | Miyase | ............. | H01L 21/02378 |

(Continued)

FOREIGN PATENT DOCUMENTS

| | | |
|---|---|---|
| EP | 4 170 073 A1 | 4/2023 |
| JP | 2007-506289 A | 3/2007 |

(Continued)

OTHER PUBLICATIONS

Japanese Office Action ("Notice of Reasons for Refusal") mailed Jul. 5, 2022 for counterpart Japanese Patent Application No. 2022-090957.

(Continued)

*Primary Examiner* — Jaehwan Oh
(74) *Attorney, Agent, or Firm* — Sughrue Mion, PLLC

(57) ABSTRACT

A SiC single crystal substrate of an embodiment has a diameter being 199 mm or more, wherein the density of threading dislocations per area of 0.25 mm$^2$ arbitrarily selected in the main surface of the SiC single crystal substrate is 5×10$^4$/cm$^2$ or less, and the threading dislocations include a threading edge dislocation.

6 Claims, 6 Drawing Sheets

(56) References Cited

U.S. PATENT DOCUMENTS

| | | | |
|---|---|---|---|
| 2021/0230769 A1* | 7/2021 | Khlebnikov | C30B 29/36 |
| 2023/0053509 A1* | 2/2023 | Liu | C30B 33/02 |
| 2023/0260841 A1* | 8/2023 | Radu | C23C 16/325 |
| | | | 438/478 |

FOREIGN PATENT DOCUMENTS

| | | |
|---|---|---|
| JP | 2014-043365 A | 3/2014 |
| JP | 2016-183108 A | 10/2016 |
| JP | 2017-031049 A | 2/2017 |
| JP | 2018-016542 A | 2/2018 |
| JP | 2018-104231 A | 7/2018 |
| JP | 2019-026500 A | 2/2019 |
| JP | 2020-033230 A | 3/2020 |
| JP | 2021-050112 A | 4/2021 |
| JP | 2021-057606 A | 4/2021 |
| JP | 2021-070623 A | 5/2021 |
| KR | 10-2014-0126371 A | 10/2014 |
| KR | 10-1539927 B1 | 7/2015 |
| TW | 202136598 A | 10/2021 |
| WO | 2013/005347 A1 | 1/2013 |
| WO | 2018/123881 A1 | 7/2018 |

OTHER PUBLICATIONS

Japanese Office Action ("Notice of Reasons for Refusal") mailed Dec. 6, 2022 for counterpart Japanese Patent Application No. 2022-090957.

Japanese Office Action ("Decision to Grant") mailed May 9, 2023 for counterpart Japanese Patent Application No. 2022-090957.

Dow Corning Toray Develops Defect-guaranteed 6-inch SiC Wafer-, Toray Dow Corning , EE Times Japan, Sep. 18, 2014, <https://eetimes.itmedia.co.jp/ee/articles/1409/18/news081.html>.

* cited by examiner

SiC SINGLE CRYSTAL SUBSTRATE

BACKGROUND OF THE INVENTION

Field of the Invention

The present disclosure relates to a SiC single crystal substrate.

Priority is claimed on Japanese Patent Application No. 2022-090957, filed on Jun. 3, 2022, the content of which is incorporated herein by reference.

Description of Related Art

Silicon carbide (SiC) has a breakdown electric field larger by one digit than and the band gap three times larger than those of silicon (Si). Moreover, silicon carbide (SiC) has characteristics such as thermal conductivity being about three times higher than silicon (Si). Silicon carbide (SiC) is expected to be applied to power devices, high frequency devices, high temperature operation devices, and the like. For such SiC devices, a SiC epitaxial wafer is used recently.

SiC epitaxial wafers are obtained by laminating a SiC epitaxial layer on the surface of a SiC single crystal substrate. Hereafter, the substrate before the lamination of the SiC epitaxial layer is referred to as a SiC single crystal substrate, and the substrate after the lamination of the SiC epitaxial layer is referred to as a SiC epitaxial wafer. SiC single crystal substrates are cut from a SiC single crystal ingot.

In order to realize a SiC device that takes advantage of the excellent characteristics of SiC as described above, it has been proposed to use a SiC substrate with a reduced density of crystal defects (see, Patent Literatures 1 to 3).

CITATION LIST

Patent Literature

Patent Literature 1: Japanese Unexamined Patent Application, First Publication No. 2017-31049
Patent Literature 2: Japanese Unexamined Patent Application, First Publication No. 2016-183108
Patent Literature 3: Japanese Unexamined Patent Application, First Publication No. 2021-50112

Dislocations such as threading edge dislocation (TED), threading screw dislocation (TSD) and basal plane dislocation (BPD) are known as typical crystal defects. Etching, photoluminescence, X-ray topography and transmission electron diffraction methods are known as methods for evaluating dislocations.

The inventors have found, by combining the etching method and the photoluminescence method, and evaluating results obtained by these methods after careful consideration, that when the threading edge dislocation (TED) and the threading screw dislocation (TSD) (Hereinafter, the threading edge dislocation and threading screw dislocation may be collectively referred to as "threading dislocation".) are locally densely packed in a SiC substrate above a predetermined density, dense areas of stacking faults or triangular defects are generated in a SiC epitaxial wafer at a location corresponding to the dense area of the threading dislocations after forming a SiC epitaxial layer on the SiC substrate. Based on this finding, the inventors have developed a SiC substrate with reduced local dense of threading dislocations, which can suppress the generation of areas densely packed with stacking faults and triangular defects after epitaxial growth.

In view of the above circumstances, the present disclosure has been made to provide a SiC single crystal substrate in which the local dense of threading dislocations is reduced.

SUMMARY OF THE INVENTION

The present disclosure provides the following means to solve the above problems.

An aspect of the present disclosure provide a SiC single crystal substrate, wherein the diameter is 199 mm or more, the density of threading dislocations per area of 0.25 mm$^2$ arbitrarily selected in the main surface of the SiC single crystal substrate is $5 \times 10^4$/cm$^2$ or less, and the threading dislocations include a threading edge dislocation.

In the SiC single crystal substrate according to the above aspect, the density of threading dislocations may be $2.2 \times 10^4$/cm$^2$ or less.

In the SiC single crystal substrate according to the above aspect, the density of threading dislocations may be $1.0 \times 10^4$/cm$^2$ or less.

In the SiC single crystal substrate according to the above aspect, the blackness, which is defined as {(average of background portion−minimum value of PL black portion)/standard deviation of background portion} in the contrast of a PL image, in PL emission obtained using an excitation wavelength of 313 nm may be 5.3 or less.

In the SiC single crystal substrate according to the above aspect, the blackness in PL emission obtained using an excitation wavelength of 313 nm may be 3.8 or less.

In the SiC single crystal substrate according to the above aspect, the blackness in PL emission obtained using an excitation wavelength of 313 nm may be 2.4 or less.

The SiC single crystal substrate of the present disclosure can provide a SiC single crystal substrate in which the local dense of threading dislocations is reduced.

DETAILED DESCRIPTION OF THE INVENTION

Hereinafter, the present embodiment will be described in detail with reference to the drawings. The drawings used in the following description may show, for convenience's sake, the features of the present disclosure in enlarged form, and the dimensional proportions of the components may be different from those in practice. The materials, dimensions, and the like exemplified in the following description are only examples, and the present disclosure is not limited thereto, and the disclosure can be carried out by appropriately changing the gist thereof without changing it. In addition, in each figure, components known to those skilled in the art other than those described in the figure may be omitted.

Figure 1:
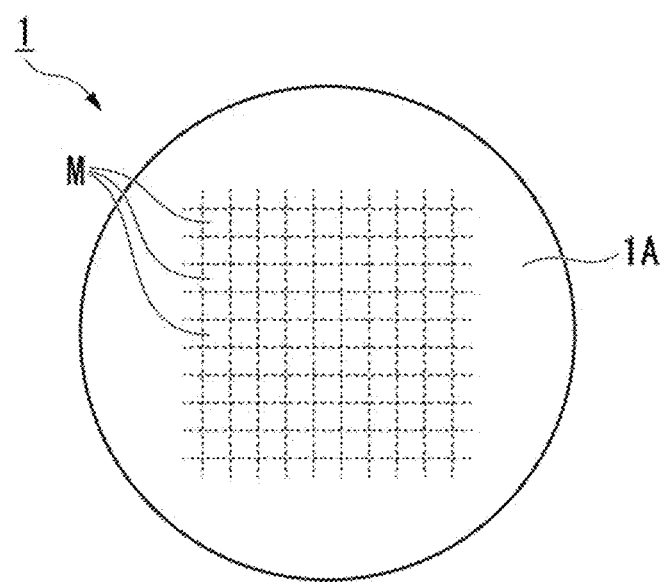
FIG. 1 is a schematic plan view of a SiC single crystal substrate according to the present embodiment.

FIG. 1 is a schematic plan view of a SiC single crystal substrate according to the present embodiment.

In the SiC single crystal substrate 1 shown in FIG. 1, the density of threading dislocations in an area M of 0.25 mm arbitrarily selected in the main surface 1A of the SiC single crystal substrate 1 is $5 \times 10^4/cm^2$ or less.

In the SiC single crystal substrate 1, the density of threading dislocations in an area M of 0.25 mm² arbitrarily selected in the main surface 1A of the SiC single crystal substrate 1 is preferably $2.2 \times 10^4/cm^2$ or less.

In the SiC single crystal substrate 1, the density of threading dislocations in an area M of 0.25 mm² arbitrarily selected in the main surface 1A of the SiC single crystal substrate 1 is more preferably $1.0 \times 10^4/cm^2$ or less.

In FIG. 1, areas M are shown only on a portion of the substrate 1.

The SiC single crystal substrate 1 shown in FIG. 1 has a configuration in which the density of threading dislocations is $5 \times 10^4/cm^2$ or less per arbitrary 0.25 mm² area M on the entire surface 1A of the substrate, in other words, the density of threading dislocations is $5 \times 10^4/cm^2$ or less for any chosen area M of 0.25 mm² on the entire surface 1A of the substrate, thereby suppressing the local occurrence of areas densely packed with stacking faults and triangular defects in the SiC epitaxial wafer after subsequent epitaxial growth.

Here, a "stacking fault" refers to a defect originated from the disorder of the stacking structure of the crystal lattice.

A "triangular defect" is a kind of stacking fault in the broad sense, and it means a defect formed in a direction in which the apex of a triangle and its opposite side (base) are lined up sequentially in a step-flow growth direction. That is, the opposite side (base) of the triangular defect is disposed in a direction perpendicular to the <11–20> direction. The triangular defect starts at the apex of a triangle and grows with step-flow growth to increase their area while maintaining the similarity of the triangular shape. Generally, a triangular defect whose starting point is generated in the early stage of growth of the SiC epitaxial film has a larger size, and from the size of the triangular defect, the depth of the starting point in the film can be estimated. The fact that the PL images of the triangular defects shown in FIG. 2 are all of the same size suggests that the starting points of the triangular defects are originated from threading dislocations located on the surface of the substrate.

In the present specification, "threading dislocations" in "the density of threading dislocations" refers to the sum of threading edge dislocations (TED) and threading screw dislocations (TSD).

The presence of dislocations in the SiC substrate can be visualized by photoluminescence (PL). Specifically, the in-plane distribution of PL intensity when the surface of a sample is irradiated with excitation light can be photographed by a camera and obtained as a two-dimensional image. In PL images, dislocations can be detected on the basis of their contrasts, because areas without dislocations are bright and areas with dislocations are dark (appear black).

The type of dislocation can be determined from the shape of the etch pit that appears by KOH etching using an optical microscope, electron microscope or the like. In general, an etch pit with a medium hexagonal shape and having a core corresponds to a threading screw dislocation (TSD), an etch pit with a small hexagonal shape having a core corresponds to a threading edge dislocation (TED).

Figure 2A:
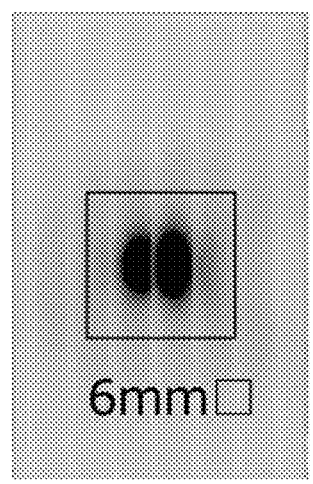
FIG. 2A is a PL image of a SiC substrate before epitaxial growth.
Figure 2B:
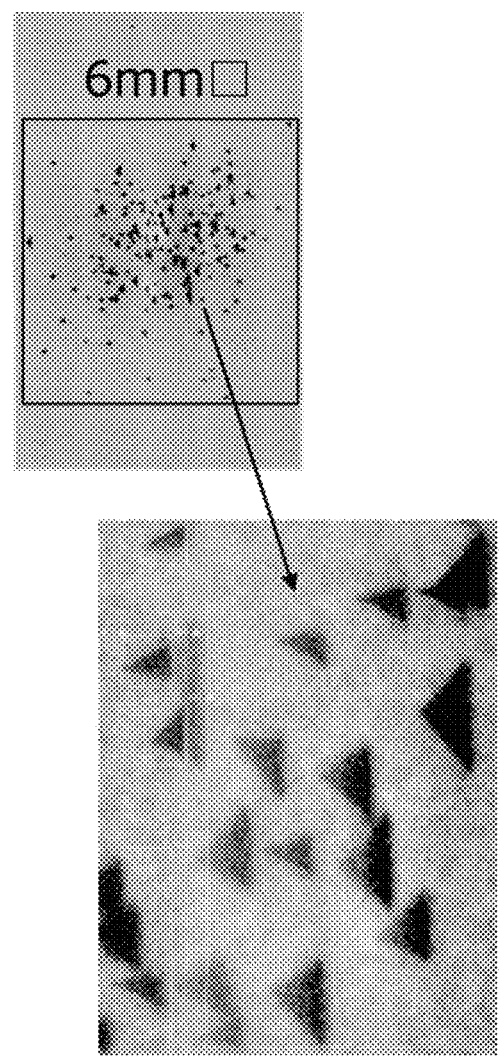
FIG. 2B is a PL image of a SiC substrate after epitaxial growth and an enlarged PL image of a part of the portion indicated by the 6 mm square flame in the PL image placed above.

FIG. 2 shows PL images before and after epitaxial growth. FIG. 2A shows a PL image of a SiC substrate before epitaxial growth. FIG. 2B shows a PL image (which is placed above in FIG. 2B) of a SiC epitaxial wafer after growing an epitaxial film with a thickness of about 10 μm on the SiC substrate, and an enlarged PL image (which is placed below in FIG. 2B) of a part of the portion indicated by the 6 mm square flame in the PL image placed above.

FIGS. 2A and 2B are PL images of the same location including the center of the substrate, which were reflected images obtained with a photoluminescence apparatus (Lasertec Co., Ltd., SICA88) using excitation light of a wavelength of 313 nm and a light-receiving wavelength with a near-infrared wavelength (660 nm or more).

By comparing the PL images of FIGS. 2A and 2B, it can be seen that a number of stacking faults and/or triangular defects have generated in the part of FIG. 2B, which corresponds to the portion appearing black in the square flame in the PL image shown in FIG. 2A (hereinafter sometimes referred to as "PL black portion".). It was confirmed by molten KOH etching that the PL black portion in the PL image shown in FIG. 2A is a portion where threading dislocations are concentrated (hereinafter sometimes referred to as "threading dislocation dense portion"). The threading dislocation dense portion is a portion where threading dislocations are densely packed with a higher density than the density of the threading dislocations in the entire in-plane.

The inventors have found that the occurrence of stacking and/or triangular defects in SiC epitaxial wafers depends largely on the degree of dense of threading dislocations in the SiC substrate, i.e., the threading dislocation density. Table 1 shows the relationship between the threading dislocation density in the SiC substrate and the occurrence of stacking faults and/or triangular defects in the SiC epitaxial wafer after epitaxial growth in the 6 mm square area including the center of the substrate for seven SiC substrates.

TABLE 1

| SiC SINGLE CRYSTAL SUBSTRATE | | SiC EPITAXIAL WAFER | |
|---|---|---|---|
| THREADING DISLOCATION DENSITY [/cm$^2$] | PL BLACK PORTION | STACKING FAULT | TRIANGULAR DEFECT |
| $1.0 \times 10^4$ | absent | absent | absent |
| $2.2 \times 10^4$ | present | absent | absent |
| $2.7 \times 10^4$ | present | present | absent |
| $5.0 \times 10^4$ | present | present | absent |
| $6.0 \times 10^4$ | present | present | present |
| $1.0 \times 10^5$ | present | present | present |
| $2.0 \times 10^5$ | present | present | present |

In Table 1, the presence or absence of PL black portions in SiC substrates was visually determined. The threading dislocation density in the SiC substrate was calculated using image analysis software after the surface of the SiC substrate was exposed by removing the epitaxial layer of the SiC epitaxial wafer by polishing, the microscopic image of the surface of the substrate where the etch pits were exposed by molten KOH etching was taken by an optical microscope, and the microscopic image was taken into a computer.

In addition, the presence or absence of stacking faults and triangular defects in the SiC epitaxial wafer is judged using a confocal differential interference microscope of an inspection apparatus equipped with both a confocal differential interference microscope and a photoluminescence (PL) (Lasertec Co., Ltd., SICA88).

As shown in Table 1, PL black portions were not observed in the substrate with a threading dislocation density of $1.0 \times 10^4$ [/cm$^2$]. Accordingly, neither stacking faults nor triangular defects were not observed in the 6 mm square area including the center of the SiC epitaxial wafer after epitaxial growth. PL black portions were observed in the substrate with a threading dislocation density of $2.2 \times 10^4$ [/cm$^2$], but Neither stacking faults nor triangular defects were not observed in the 6 mm square area including the center of the SiC epitaxial wafer after epitaxial growth. PL black portions were observed both in the substrate with a threading dislocation density of $2.7 \times 10^4$ [/cm$^2$] and in the substrate with a threading dislocation density of $5.0 \times 10^4$ [/cm$^2$]. Stacking faults were observed and triangular defects were not observed in the 6 mm square area including the center of the SiC epitaxial wafer after epitaxial growth. PL black portions were observed all in the substrate with a threading dislocation density of $6.0 \times 10^4$ [/cm$^2$], in the substrate with a threading dislocation density of $1.0 \times 10^5$ [/cm$^2$] and in the substrate with a threading dislocation density of $2.0 \times 10^5$ [/cm$^2$]. Stacking faults and triangular defects were observed in the 6 mm square area including the center of the SiC epitaxial wafer after epitaxial growth for all of the substrates.

Figure 3:
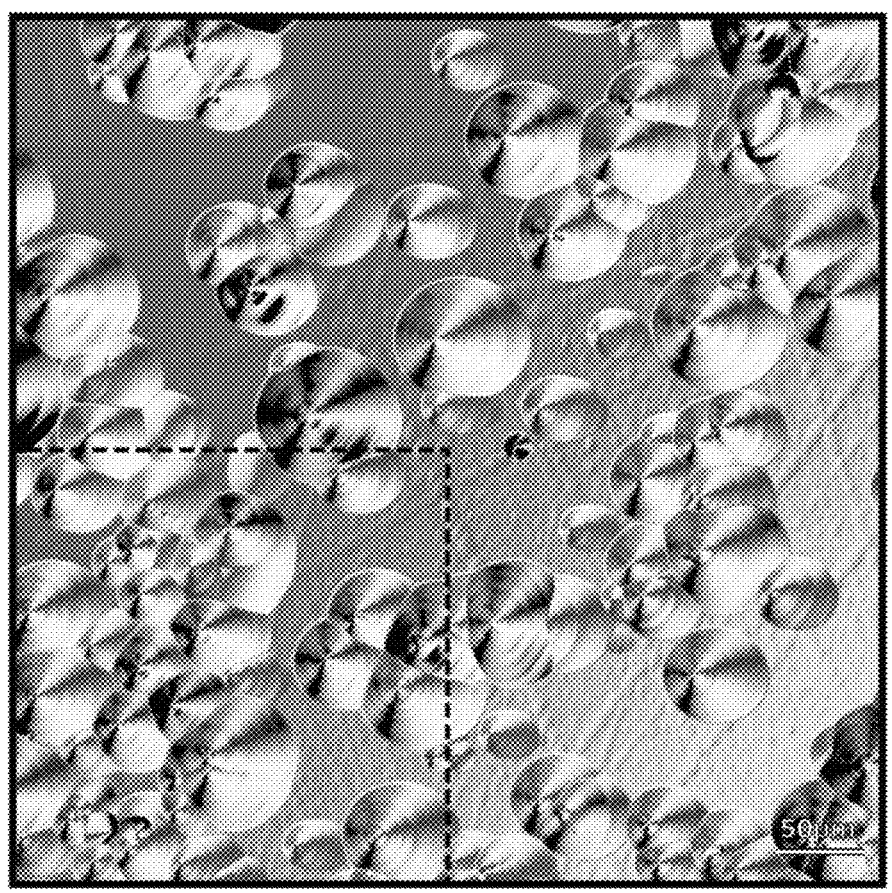
FIG. 3 is a confocal differential interference microscope image of a 1 mm square including the center of the surface of the SiC substrate where the etch pits were exposed by molten KOH etching.

FIG. 3 shows a confocal differential interference microscope image of a 1 nm square including the center of the surface of another SiC substrate where the etch pits were exposed by molten KOH etching. The threading dislocation density was $3.3 \times 10^4$ [/cm$^2$] in the entire image, while the threading dislocation density was $6.1 \times 10^4$ [/cm$^2$] only in the lower left quarter (dotted frame) of the image. Based on the results shown in Table 1, the threading dislocation density $3.3 \times 10^4$ [/cm$^2$] in the entire image is a threading dislocation density at which triangular defects are not generated in the SiC epitaxial wafer after epitaxial growth. The threading dislocation density $6.1 \times 10^4$ [/cm$^2$] in the lower left quarter (dotted frame) of the image is a threading dislocation density at which both stacking faults and triangular defects are generated in the SiC epitaxial wafer after epitaxial growth.

When only in a part of a 1 mm square (the lower left quarter (dotted frame)), a part with a threading dislocation density larger than $6.1 \times 10^4$ [/cm$^2$] exists locally in the surface of the SiC substrate as shown in FIG. 3, stacking faults and triangular defects are generated locally corresponding to the part of 1 mm square (the lower left quarter (dotted frame)) in the SiC epitaxial wafer after epitaxial growth.

Even if the average threading dislocation density in the entire surface of the substrate is sufficiently low, if a SiC epitaxial wafer is fabricated using a SiC substrate that locally has a non-uniform distribution of threading dislocation density with a part (area) equal to or greater than the prescribed threading dislocation density, stacking faults and triangular defects are locally generated. Thus, in order to suppress the dense of stacking faults and/or triangular defects locally generated in SiC epitaxial wafers, it is necessary to use SiC substrates without threading dislocation dense portions.

Figure 6:
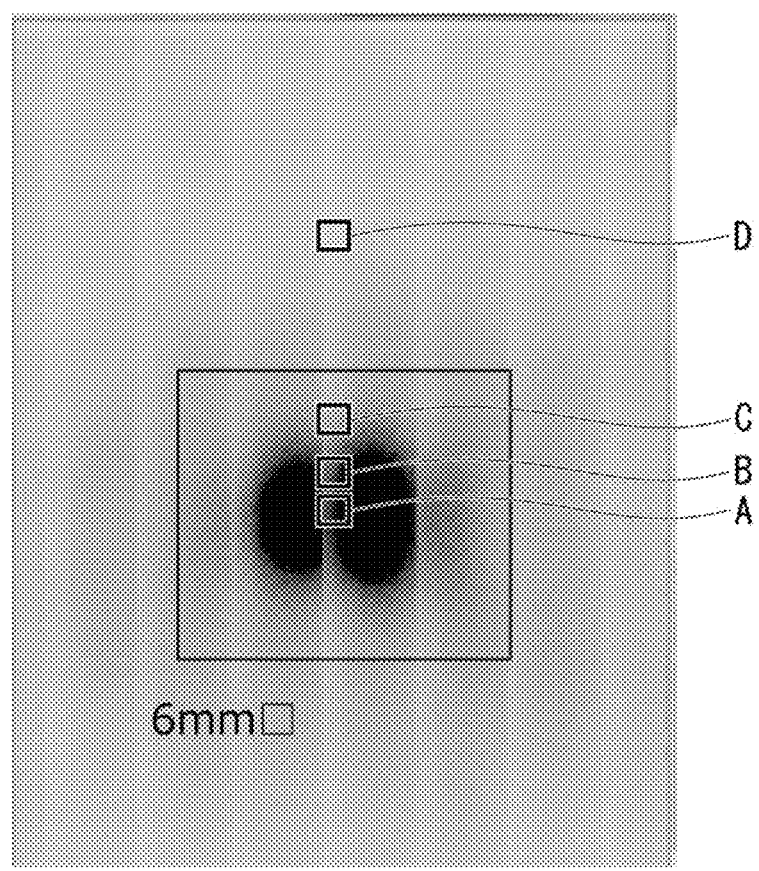
FIG. 6 is an enlarged view of the PL image shown in FIG. 2A.

The contrast of the PL image is quantified. FIG. 6 shows an enlarged view of the PL image shown in FIG. 2A. In the PL image shown in FIG. 6, the blackness (={(average of background portion−minimum value of PL black portion)/standard deviation of background portion} was 7.9, 7.0, 4.5 and 1.2 at the center of a PL black portion (a portion indicated by the symbol A in FIG. 6), at a position halfway between the center and the border of the PL black portion (a portion indicated by the symbol B in FIG. 6), at the border of the PL black portion (a portion indicated by the symbol C in FIG. 6) and at a position away from the PL black portion (a portion indicated by the symbol D in FIG. 6), respectively. Note that "average of background portion" and "standard deviation of background portion" refer to the average or standard deviation of the luminous intensity of the background portion, using the 0.8 mm square of a portion that does not appear black in the PL image (PL luminous intensity image) (For example, the neighborhood of the portion indicated by the sign D in FIG. 6) as the background portion.

The threading dislocation density at the center of the PL black portion (symbol A), at a position halfway between the center and the border of the PL black portion (symbol B), at the border of the PL black portion (symbol C), and at the position away from the PL black portion (symbol D) are $2.5 \times 10^5$ [/cm$^2$], $1.1 \times 10^5$ [/cm$^2$], $3.3 \times 10^4$ [/cm$^2$], $5.4 \times 10^3$ [/cm$^2$], respectively. From the correlation between the blackness and the threading dislocation density, assuming that the blackness is K and the threading dislocation density is D [/cm$^2$], the K can be calculated by the following formula:

$$K = 1/0.5571 \times \ln(D/2663.1)$$

From the above formula, when the threading dislocation density is $1.0 \times 10^4$ [/cm$^2$], $2.2 \times 10^4$ [/cm$^2$], $2.7 \times 10^4$ [/cm$^2$], $5.0 \times 10^4$ [/cm$^2$], $6.0 \times 10^4$ [/cm$^2$], $1.0 \times 10^5$ [/cm$^2$], the blackness is determined to be 2.4, 3.8, 4.2, 5.3, 5.6, 6.5, respectively.

In the PL image of the SiC substrate 1, in an area where the blackness is 2.4, no PL black portion appears, and it is considered that there are no stacking faults and triangular defects in the area of the SiC epitaxial wafer after epitaxial growth. In an area where the blackness is 3.8, PL black portions appear, and it is considered that there are no stacking faults and triangular defects in the area of the SiC epitaxial wafer after epitaxial growth. In areas where the blackness is 4.2 and 5.3, PL black portions appear, and it is considered that there are stacking faults and there are no triangular defects in the area of the SiC epitaxial wafer after epitaxial growth. In areas where the blackness is 5.6 and 6.5, PL black portions appear, and it is considered that there both are stacking faults and triangular defects in the area of the SiC epitaxial wafer after epitaxial growth.

Therefore, in the PL image of the SiC substrate 1, the blackness is preferably 5.3 or less, more preferably 3.8 or less, and even more preferably 2.4 or less.

Although there are no particular restrictions on the outer shape of the SiC single crystal substrate 1, substrates with various flat shapes and various thicknesses can be used, but the substrate is typically disk-shaped. The thickness of the SiC single crystal substrate can be in the range of, for example, 300 μm to 650 μm.

If the SiC substrate 1 is disk-shaped, the dimension may be, for example, 6 inches (145 mm to 155 mm) in diameter and 8 inches (190 mm to 205 mm) in diameter. The diameter of the SiC substrate 1 may be 149 mm or more and 199 mm or more.

The SiC substrate 1 may have a diameter of 149 mm or more. The SiC substrate 1 may have a diameter of 199 mm or more.

Figure 4A:
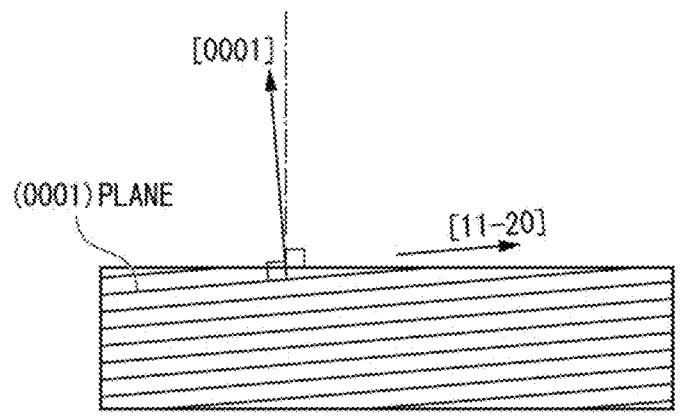
FIG. 4A is a schematic cross-sectional view cut perpendicular to the main surface of the SiC substrate.
Figure 4B:
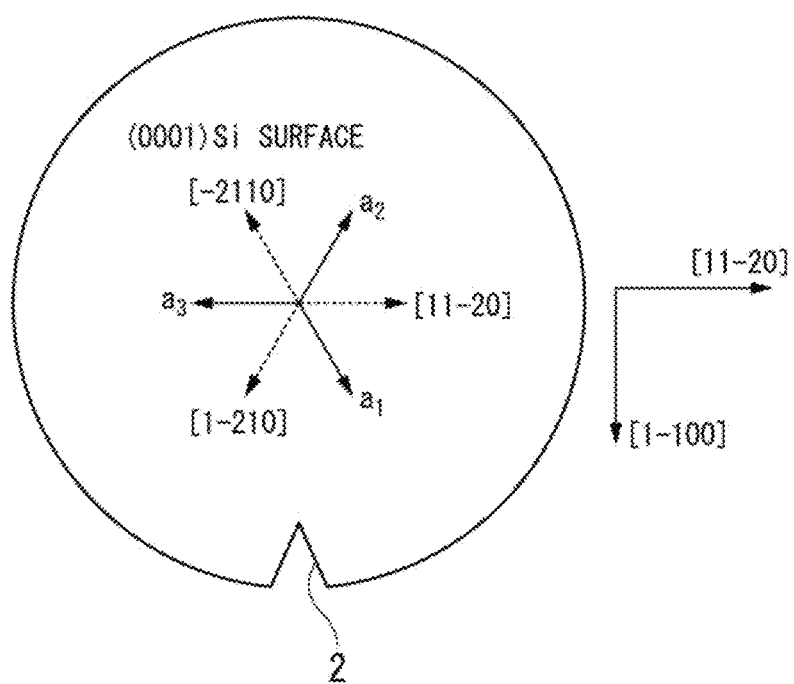
FIG. 4B is a schematic plan view from the direction perpendicular to the main surface of the SiC substrate.

The SiC single crystal substrate 1 is preferably 4H—SiC, because SiC comes in a variety of polytypes, but 4H—SiC is mainly used to make practical SiC devices FIG. 4 is a schematic view showing the plane orientation of the SiC substrate, FIG. 4A is a schematic cross-sectional view cut perpendicular to the main surface, and FIG. 4B is a schematic plan view from the direction perpendicular to the main surface.

The SiC substrate 1 may have a main surface with an off angle ranging from 0° to 6° in the <11–20> direction and/or from 0° to 0.5° in the <1–100> direction with respect to the (0001) plane.

Since the larger the off angle, the smaller the number of wafers obtained from the SiC single crystal ingot, the smaller the off angle is preferable from the viewpoint of cost reduction.

The SiC single crystal substrate 1 has a notch 2, which is a marker of the crystal orientation, but may have OF (orientation flat) instead of notch 2.

(Method of Manufacturing SiC Single Crystal Substrate)

In order to manufacture a SiC single crystal substrate without threading dislocation dense portions, that is, a SiC single crystal substrate in which the density of threading dislocations per area of 0.25 mm² arbitrarily selected in the main surface of the substrate is $5 \times 10^4/cm^2$ or less, a SiC single crystal is grown using a seed crystal without threading dislocation dense portions, that is, a seed crystal in which the density of threading dislocations per area of 0.25 mm² arbitrarily selected in the main surface is $5 \times 10^4/cm^2$ or less.

Conventional seed single crystals have more than a few threading dislocation dense portions. The presence of local threading dislocation dense portions was not recognized because the local threading dislocation dense portion was not noticed.

A method for preparing a seed crystal without threading dislocation dense portions is described with reference to FIG. 5.

Figure 5A:
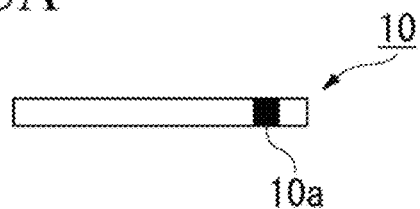
FIG. 5A is a schematic cross-sectional view showing a step in which a combination of molten KOH etching and photoluminescence (PL) is used to identify the location of threading dislocation dense portions in the seed crystal in a method for preparing a seed crystal without threading dislocation dense portions.

(1) First, as shown in FIG. 5A, a combination of molten KOH etching and photoluminescence (PL) is used to identify the location 10a of the threading dislocation dense portions in the seed crystal 10 in a manner similar to that used in the measurement of defects in the SiC substrate.

Figure 5B:
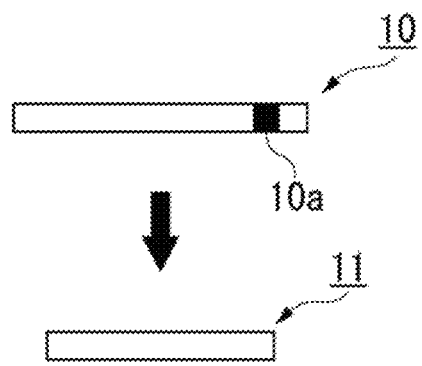
FIG. 5B is a schematic cross-sectional view showing a step in which a portion including the location of the threading dislocation dense portions is removed and processed to make a small seed crystal without the location of the threading dislocation dense portions again.

(2) Then, as shown in FIG. 5B, a portion including the location 10a of the threading dislocation dense portions is removed and processed to make a small seed crystal 11 without the location 10a of the threading dislocation dense portions again. Even if a threading dislocation dense portion is formed closer to the center, the threading dislocation dense portion can be processed to be removed to obtain a seed crystal, and then a seed crystal with a sufficient size can be grown by an increase in diameter.

Figure 5C:
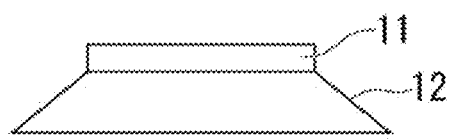
FIG. 5C is a schematic cross-sectional view showing a step in which crystal growth continues until a seed crystal with a sufficient size is obtained.

(3) Next, as shown in FIG. 5C, crystal growth continues until a seed crystal with a sufficient size is obtained and the diameter of the seed crystal is enlarged. The symbol 12 denotes a portion with enlarged diameter.

Figure 5D:
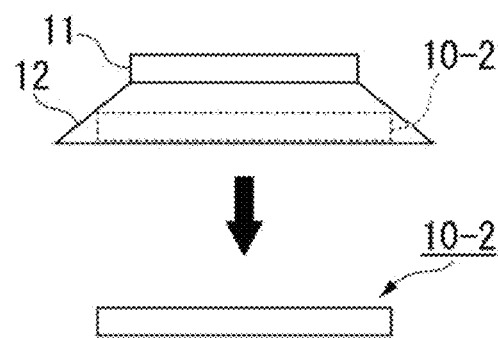
FIG. 5D is a schematic cross-sectional view showing a step in which a seed crystal 10-2 larger than the seed crystal 11 is cut from the portion with enlarged diameter 12, and the single crystal is grown using this seed crystal 10-2.

(4) Next, as shown in FIG. 5D, a seed crystal 10-2 larger than the seed crystal 11 is cut from the portion with enlarged diameter 12, and the single crystal is grown using this seed crystal 10-2.

(5) The above steps (1) to (4) are repeated until a seed crystal without threading dislocation dense portions is obtained.

A SiC single crystal ingot is obtained by using the seed crystal without threading dislocation dense portions obtained in the above manner and growing a single crystal. Then, a SiC single crystal substrate with the density of threading dislocations per area of 0.25 mm² arbitrarily selected in the main surface of the substrate of $5 \times 10^4/cm^2$ or less can be obtained by performing conventional substrate processing (cylindrical processing, slicing to polishing) on the SiC single crystal ingot.

EXPLANATION OF REFERENCES

1 SiC single crystal substrate

What is claimed is:

1. A SiC single crystal substrate, wherein a diameter of the SiC single crystal substrate is 199 mm or more, a density of threading dislocations per area of 0.25 mm² is $5 \times 10^4/cm^2$ or less in very unit area, which is 0.25 mm² of a main surface of the SiC single crystal substrate, and the threading dislocations consist of threading edge dislocations and threading screw dislocations.

2. The SiC single crystal substrate according to claim 1, wherein the density of threading dislocations is $2.2 \times 10^4/cm^2$ or less.

3. The SiC single crystal substrate according to claim 2, wherein the density of threading dislocations is $1.0 \times 10^4/cm^2$ or less.

4. The SiC single crystal substrate according to claim 1, wherein a blackness in photoluminescence (PL) emission obtained using an excitation wavelength of 313 nm and a light-receiving wavelength of 660 nm or more is 5.3 or less.

5. The SiC single crystal substrate according to claim 2, wherein a blackness in PL emission obtained using an excitation wavelength of 313 nm and a light-receiving wavelength of 660 nm or more is 3.8 or less.

6. The SiC single crystal substrate according to claim 3, wherein a blackness in PL emission obtained using an excitation wavelength of 313 nm and a light-receiving wavelength of 660 nm or more is 2.4 or less.

* * * * *